United States Patent
Feng et al.

(10) Patent No.: US 11,545,486 B2
(45) Date of Patent: Jan. 3, 2023

(54) INTEGRATED THIN FILM RESISTOR AND METAL-INSULATOR-METAL CAPACITOR

(71) Applicant: GLOBALFOUNDRIES Singapore Pte. Ltd., Singapore (SG)

(72) Inventors: Chengang Feng, Singapore (SG); Yanxia Shao, Singapore (SG); Yudi Setiawan, Singapore (SG); Handoko Linewih, Singapore (SG); Xuesong Rao, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 130 days.

(21) Appl. No.: 17/062,292

(22) Filed: Oct. 2, 2020

(65) Prior Publication Data

US 2022/0108980 A1    Apr. 7, 2022

(51) Int. Cl.
  *H01L 27/06*    (2006.01)
  *H01L 49/02*    (2006.01)

(52) U.S. Cl.
  CPC .......... *H01L 27/0682* (2013.01); *H01L 28/20* (2013.01); *H01L 28/60* (2013.01)

(58) Field of Classification Search
  CPC ........................... H01L 27/0682; H01L 28/20
  See application file for complete search history.

(56) References Cited

U.S. PATENT DOCUMENTS

| | | | |
|---|---|---|---|
| 6,534,374 B2 | 3/2003 | Johnson et al. | |
| 6,730,573 B1 | 5/2004 | Ng et al. | |
| 7,022,246 B2 | 4/2006 | Chinthakindi et al. | |
| 7,323,751 B2 | 1/2008 | Beach et al. | |
| 8,445,353 B1 * | 5/2013 | Raghavan | H01L 28/20 |
| | | | 257/E27.025 |
| 8,754,501 B2 | 6/2014 | Khan et al. | |
| 9,029,983 B2 | 5/2015 | Chen et al. | |
| 9,281,355 B2 | 3/2016 | Dirnecker | |
| 9,595,662 B2 | 3/2017 | Li et al. | |
| 10,651,236 B2 | 5/2020 | Lee et al. | |
| 10,651,373 B2 | 5/2020 | Peng et al. | |
| 10,741,748 B2 | 8/2020 | Maniscalco et al. | |

(Continued)

FOREIGN PATENT DOCUMENTS

WO    2017155508    9/2017

OTHER PUBLICATIONS

Specification and Drawings for U.S. Appl. No. 17/139,117, filed Dec. 31, 2020, 23 pages.

*Primary Examiner* — John A Bodnar
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to an integrated thin film resistor with a metal-insulator-metal capacitor and methods of manufacture. The structure includes: a first buffer contact on a substrate; a second buffer contact on the substrate, the second buffer contact being on a same wiring level as the first buffer contact; a resistive film contacting the first buffer contact and the second buffer contact, the resistive film extending on the substrate between the first buffer contact and the second buffer contact; and electrical contacts landing on both the first buffer contact and the second buffer contact, but not directly contacting with the resistive film.

16 Claims, 6 Drawing Sheets

(56) References Cited

U.S. PATENT DOCUMENTS

2004/0241951 A1     12/2004   Amadon et al.
2012/0049997 A1*    3/2012    Lim .................... H01L 23/5228
                                                              338/308
2013/0341759 A1*    12/2013   Khan ...................... H01L 28/24
                                                              257/533

* cited by examiner

INTEGRATED THIN FILM RESISTOR AND METAL-INSULATOR-METAL CAPACITOR

FIELD OF THE INVENTION

The present disclosure relates to semiconductor structures and, more particularly, to an integrated thin film resistor with a metal-insulator-metal capacitor and methods of manufacture.

BACKGROUND

A resistor is an electrical component that provides an electrical resistance into an integrated circuit by restricting current that flows through the circuit. A thin film resistor is a resistor that possesses a thin resistive layer, where the thickness of the thin film resistive layer provides different resistive properties. A thin film resistor in semiconductor systems exhibits, i.e. higher accuracy, low Temperature Coefficient of Resistance (TCR) and its placement can be provided in-between any metal level at the back end of the line (BEOL). The thin film resistor can be integrated with other components of the integrated circuit such as, e.g., metal-insulator-metal capacitors. The materials used for these other components, though, can result in many issues including, e.g., warpage of the wafer, alignment issues, etc.

To create a thin film resistor, a dense, uniform metallic alloy film is deposited onto an insulator material layer. The metallic alloy film will act as the resistive layer. After the metallic layer is deposited, it is patterned using photolithography and etching processes, followed by the formation of the electrical contact to the resistive film. In practice, though, the photolithography and etching processes can result in misalignment issues, as well as punch through issues of the resistive layer when the etching process is used to form the electrical contact to the resistive film.

SUMMARY

In an aspect of the disclosure, a structure comprises: a first buffer contact on a substrate; a second buffer contact on the substrate, the second buffer contact being on a same wiring level as the first buffer contact; a resistive film contacting the first buffer contact and the second buffer contact, the resistive film extending on the substrate between the first buffer contact and the second buffer contact; and electrical contacts landing on both the first buffer contact and the second buffer contact, but not directly contacting with the resistive film.

In an aspect of the disclosure, a structure comprises: a capacitor structure comprising: a first plate comprising a conductive material; an insulator material on the first plate; and a second plate on the insulator material, the second plate comprising the conductive material; and a thin film resistor structure comprising: a first buffer contact on a same wiring level as the first plate of the capacitor; a second buffer contact on the same wiring level as the first plate of the capacitor and the first buffer contact; and a resistive film contacting sidewalls of the first buffer contact and the second buffer contact, the resistive film being located on the same wiring level as the first plate of the capacitor, the first buffer contact and the second buffer contact.

In an aspect of the disclosure, a method comprises: forming a first buffer contact and second buffer contact each of which comprise a conductive plate; forming a resistive film on a substrate which contacts and extends between the first buffer contact and the second buffer contact; and forming electrical contacts landing on the first buffer contact and the second buffer contact, but not landing on the resistive film to avoid punch through.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an integrated thin film resistor with a metal-insulator-metal (MIM) capacitor and methods of manufacture. More specifically, the present disclosure provides an integration of a thin film resistor with high sheet resistance and low Temperature Coefficient of Resistance (TCR) into the baseline process for both Single MIM (SMIM) and Dual MIM (DMIM) capacitor options. Advantageously, the same material used for the top plate of the SMIM capacitor or the bottom plate of the DMIM capacitor can be used as a buffer contact, which will avoid the punch through during the etching process to form the electrical contacts, and extend the contact area between the sidewall of the buffer contacts and the resistive film in order to reduce the contact resistance. For example, by implementing the processes described herein, the contact will land on the buffer contact, and not land directly on the resistive film, hence, the electrical current flows from the electrical contact to the buffer contact and the resistive film.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
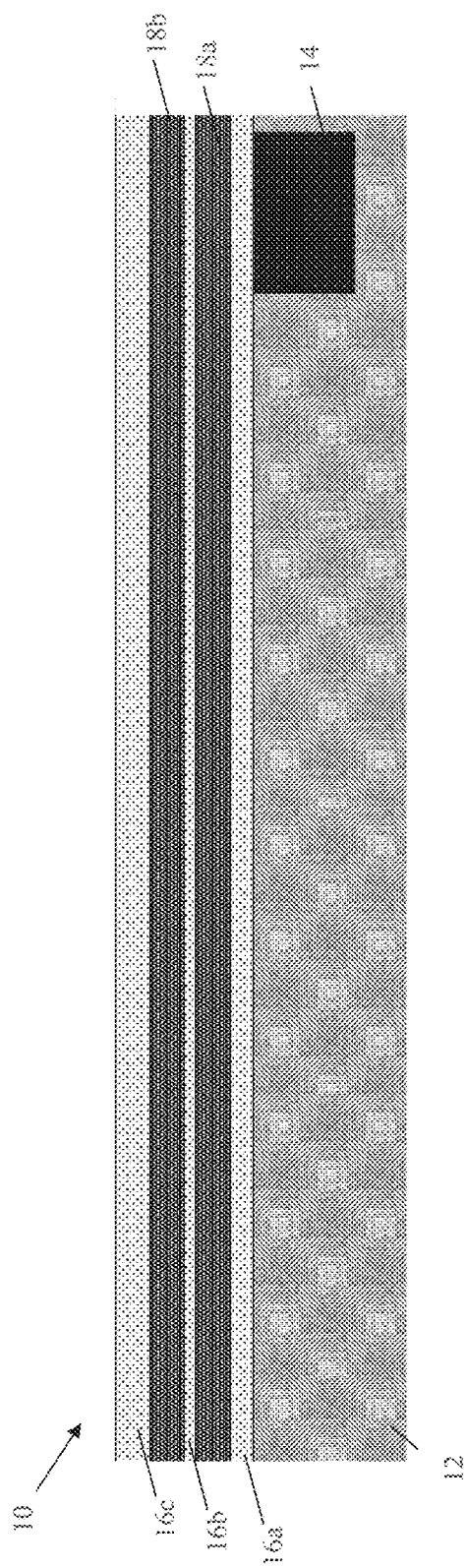
FIG. 1 shows a substrate with a stack of alternating materials, amongst other features, and respective fabrication processes in accordance with aspects of the present disclosure.

FIG. 1 shows a substrate with a stack of alternating materials, amongst other features, and respective fabrication processes in accordance with aspects of the present disclosure. More specifically, the structure 10 shown in FIG. 1 includes an insulator material 12 (e.g., also referred to as a substrate) with a stack of alternating layers of material 16a, 18a, 16b, 18b, 16c formed on the insulator material 12. In embodiments, the insulator material 12 is, e.g., interlevel dielectric material, such as an oxide material.

Figure 8:
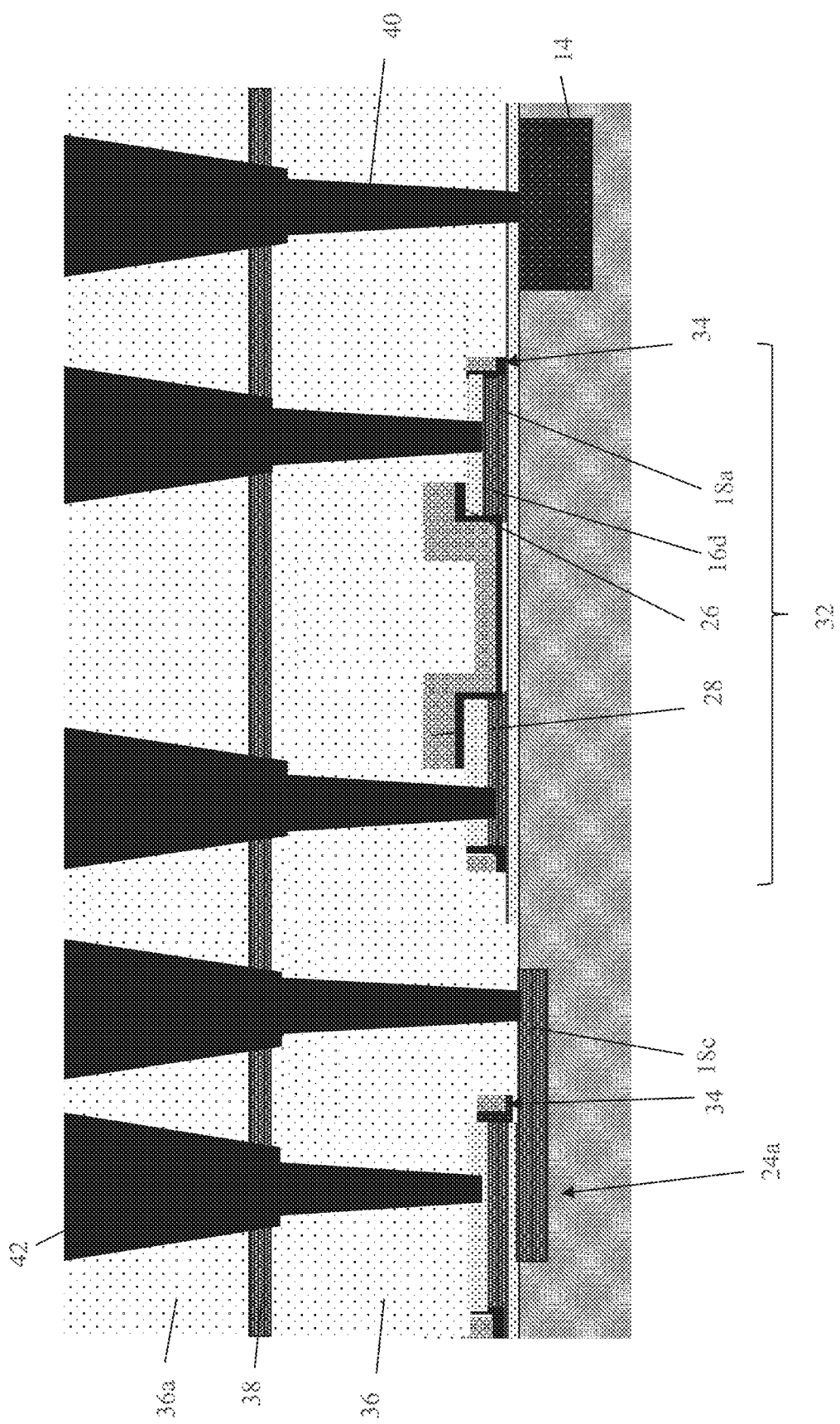
FIG. 8 shows a capacitor and thin film resistor, amongst other features, and respective fabrication processes in accordance with additional aspects of the present disclosure.

In embodiments, the stack of materials includes alternating layers of insulator material 16a, 16b, 16c and metal material 18a, 18b. In this embodiment, the bottom layer of metal material 18a can be used as a bottom plate for the MIM capacitor and a buffer contact for the thin film resistor; whereas, the top layer of metal material 18b can be used as a top plate for the MIM capacitor. The insulator material 16b can be used as an insulator material between the top plate and the bottom plate of the MIM capacitor. In alternative embodiments, as shown in FIG. 8, the bottom layer of metal material 18a can be used as a top plate for the MIM capacitor, and the insulator material 16a can be used as the insulator material between the top plate and bottom plate of the MIM capacitor.

The layers of insulator material 16a, 16b, 16c can be any appropriate high-k or low-k dielectric material depending on the specific application and required performance parameters. For example, the high-k dielectric material can be, but not limited to, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof; whereas, the low-k dielectric can be SiN material. The layers of insulator material 16a, 16b, 16c can each be deposited separately to a thickness of about 200 Å to 1000 Å, as an example, with the innermost layer of insulator material 16b being of a different thickness than the other layers of insulator material 16a, 16c. For example, the innermost layer of insulator material 16b can be thinner than the other layers of insulator material 16a, 16c to provide a higher capacitance for the subsequently formed MIM capacitor. The layers of insulator material 16a, 16b, 16c can be deposited by any conventional deposition process such as a chemical vapor deposition (CVD) process, amongst others known in the art.

The layers of metal material 18a, 18b can be any appropriate metal or metal alloy material used for both MIM capacitors and buffer contacts for a thin film resistor. For example, the layers of metal material 18a, 18b can be Ta, TaN, TiN or Al; although other materials are also contemplated herein. In embodiments, the metal material 18a, 18b can also be deposited by any conventional deposition process such as a physical vapor deposition (PVD) or CVD process to a thickness of about 200 Å to 1000 Å, as an example.

Still referring to FIG. 1, a metallization structure 14, e.g., wiring structure or interconnect structure, is formed in the substrate 12 using conventional lithography, etching and deposition methods known to those of skill in the art. For example, a resist formed over the insulator material 12 is exposed to energy (light) to form a pattern (opening). An etching process with a selective chemistry, e.g., reactive ion etching (RIE), will be used to form one or more trenches in the insulator material 12 through the openings of the resist. Following the resist removal by a conventional oxygen ashing process or other known stripants, conductive material (e.g., copper) can be deposited by any conventional deposition processes, e.g., chemical vapor deposition (CVD) processes. Any residual material on the surface of the insulator material 12 can be removed by conventional chemical mechanical polishing (CMP) processes.

Figure 2:
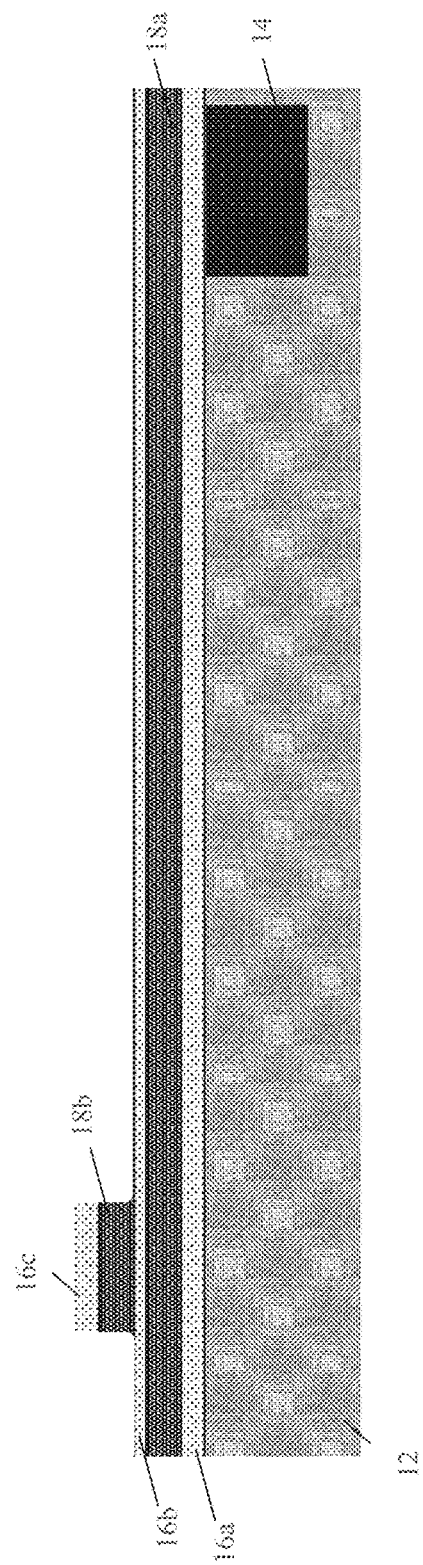
FIG. 2 shows a patterned top plate of a capacitor, amongst other features, and respective fabrication processes in accordance with aspects of the present disclosure.

FIG. 2 shows a patterned top plate of a capacitor, amongst other features, and respective fabrication processes. More specifically, FIG. 2 shows the patterning of the insulator material 16c and metal material 18b, which forms the top plate of a MIM capacitor. In this embodiment, the insulator material 16c and metal material 18b are patterned using conventional lithography and etching methods known to those of skill in the art. For example, in the etching processes, selective chemistries will be used to separately remove the insulator material 16c and metal material 18b through an opening (pattern) of resist material(s). In embodiments, the selective chemistry for etching the metal material 18b is preferably a chlorine based chemistry which will stop on the insulator material 16b.

Figure 3:
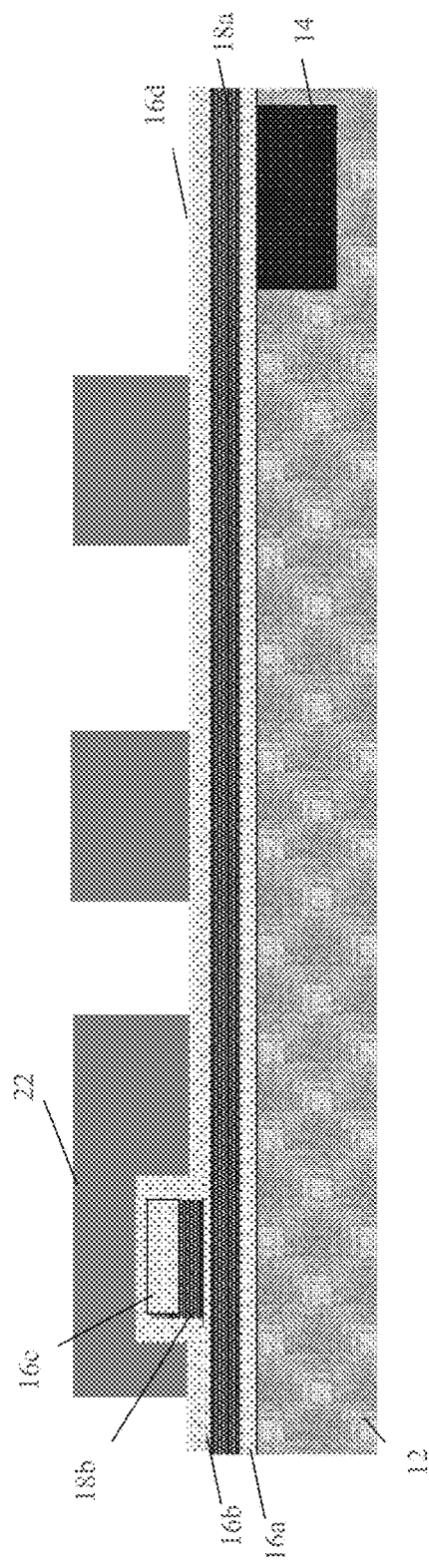
FIG. 3 shows a lithographic mask on the patterned top plate of the capacitor and locations of buffer contacts, amongst other features, and respective fabrication processes in accordance with aspects of the present disclosure.

FIG. 3 shows a lithographic mask on the patterned top plate of the capacitor and other locations which are used to form a buffer contact for the thin film resistor, amongst other features. In particular, in FIG. 3 an additional insulator material 16d is formed over the patterned insulator material 16c, metal material 18b, and the exposed insulator material 16b. In embodiments, the insulator material 16d can be deposited by a conventional deposition method, e.g., CVD, to a thickness of about 200 Å to 600 Å and, preferably, a thickness of about 400 Å, to fully cover the exposed metal material 18b. The insulator material 16d is preferably the same material as the underlying insulator materials 16c, 16b. Accordingly, the insulator material 16d can be SiN, as an example.

As further shown in FIG. 3, a lithographic mask (e.g., resist) 22 is deposited and patterned over the patterned insulator material 16c, metal material 18b and other regions of the structure. These other regions will define the buffer contact of the thin film resistor. For example, in embodiments, the lithographic mask (e.g., resist) 22 is patterned to define a bottom plate of a MIM capacitor and buffer contacts for the thin film resistor as described in more detail with respect to FIG. 4.

Figure 4:
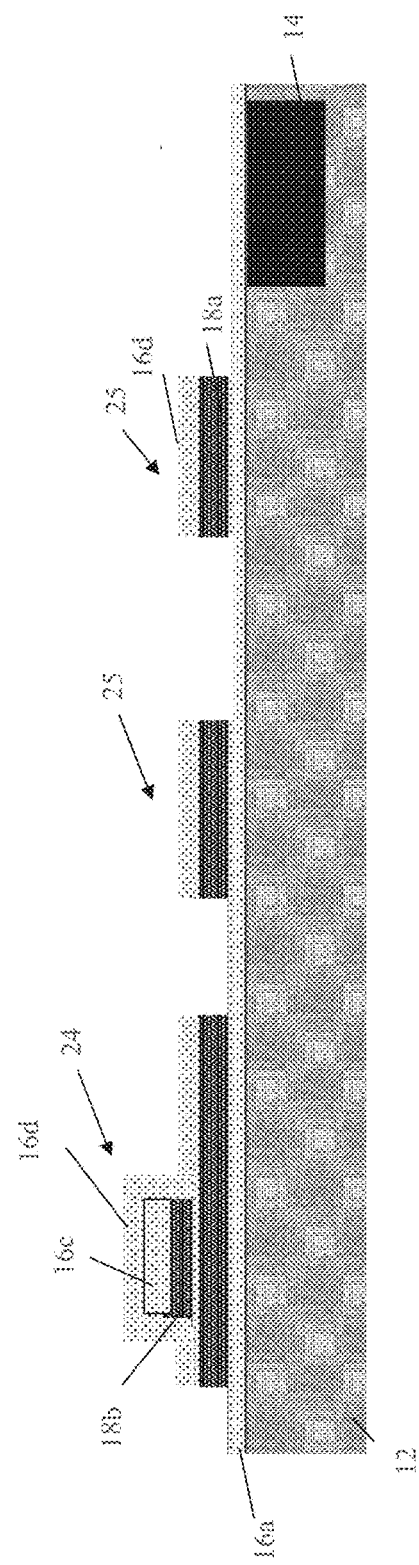
FIG. 4 shows a bottom plate of the capacitor and buffer contacts for a thin film resistor, amongst other features, and respective fabrication processes in accordance with aspects of the present disclosure.

FIG. 4 shows a bottom plate of the capacitor and buffer contacts for the thin film resistor, amongst other features. More specifically, using the lithographic mask (e.g., resist) 22 shown in FIG. 3, the insulator materials 16b, 16d and the metal material 18a are selectively patterned (e.g., etched) to form the bottom plate of the MIM capacitor 24 and buffer contacts 25 of the thin film resistor, all of which are on the same wiring level. The buffer contacts 25 will be used to avoid punch through during the etching process to form the electrical contact, and extend the contact area of the thin film resistor in order to reduce contact resistance. As to the latter advantage, for example, the buffer contacts 25 include exposed metal material 18a which will contact resistive material of the thin film resistor, below the insulator material 16b.

In embodiments, the metal material 18a will be patterned to extend beyond the top plate, e.g., patterned metal material 18b, to allow for contact formation. Also, the metal material 18a is subjected to an over etching process to ensure that all of the metal material is removed between the buffer contacts 25. This will safeguard against any possible shorting between the metal material 18a of the buffer contacts 25. Again, the selective chemistry for etching the metal material 18a is preferably a chlorine based chemistry which will stop on the insulator material 16a.

Figure 5:
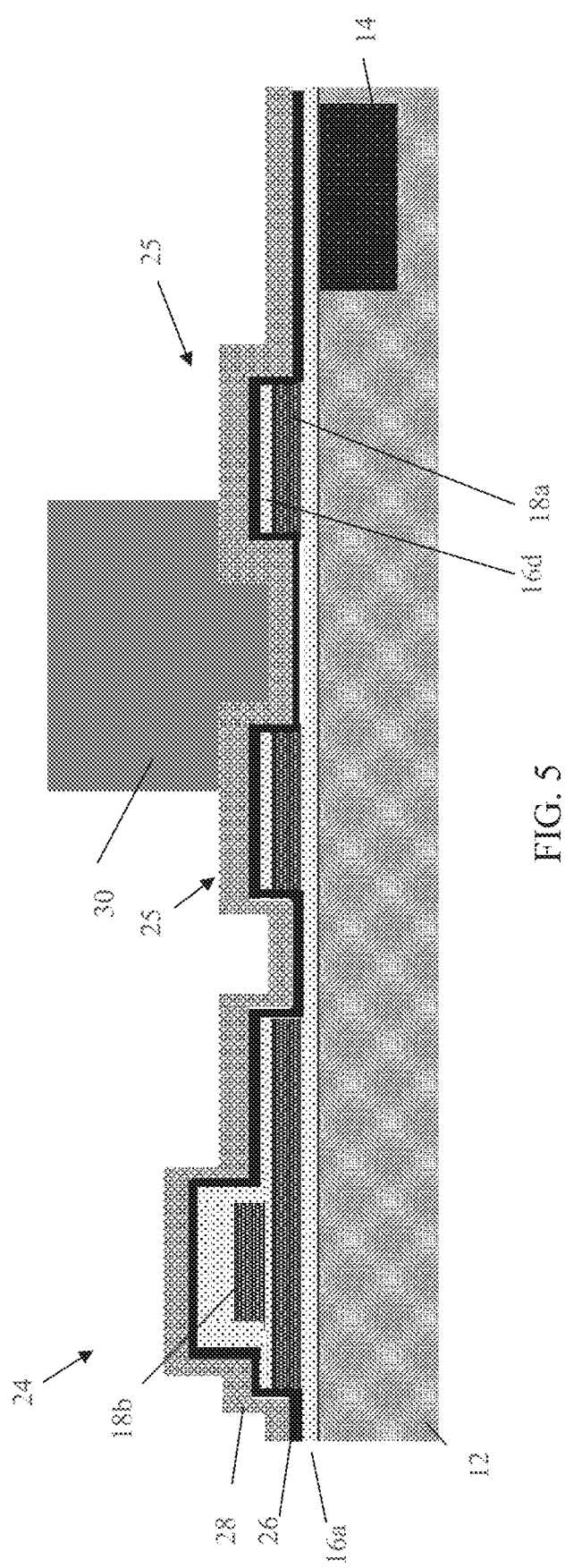
FIG. 5 shows resistive material deposited over the buffer contacts and a lithographic mask to pattern the resistive film on the buffer contacts, amongst other features, and respective fabrication processes in accordance with aspects of the present disclosure.

FIG. 5 shows a resistive metal alloy deposited over the buffer contacts 25, amongst other features. More specifically, in FIG. 5, a thin film of resistive metal alloy 26 (e.g., resistive film) is formed (e.g., deposited) over the MIM capacitor 24 and buffer contacts 25, e.g., over the exposed surfaces of the structure shown in FIG. 4. In embodiments, the thin film of resistive metal alloy 26 will rest on an upper surface of the insulator material 16d and contacts the exposed side surfaces of the metal material 18a, e.g., buffer contacts 25. The thin film of resistive metal alloy 26 can be any appropriate resistive metal alloy including, e.g., SiCr, TaNi, SiNi (or other nickel silicide materials). In further embodiments, the thin film of resistive metal alloy 26 can be doped with boron, carbon, oxygen or nitrogen. The thin film of resistive metal alloy 26 can be deposited by a sputtering deposition method to a thickness of about 30 Å to 50 Å, as an example.

Still referring to FIG. 5, a masking material 28 is deposited over the thin film of resistive metal alloy 26. In embodiments, the masking material 28 can be a hardmask composed of, e.g., SiN. A lithographic mask (e.g., resist) 30 is formed over the masking material 28 and patterned to define the thin film resistor. In embodiments, the lithographic mask (e.g., resist) 30 will be patterned to remain partly over the buffer contacts 25. This pattern will protect the thin film of resistive metal alloy 26 to ensure it remains in contact with the exposed side surfaces of the metal material 18a, while also allowing the buffer contacts 25 to be exposed during a subsequent etching process. In this way, the buffer contacts 25 will extend the contact area of the thin film resistor.

Figure 6:
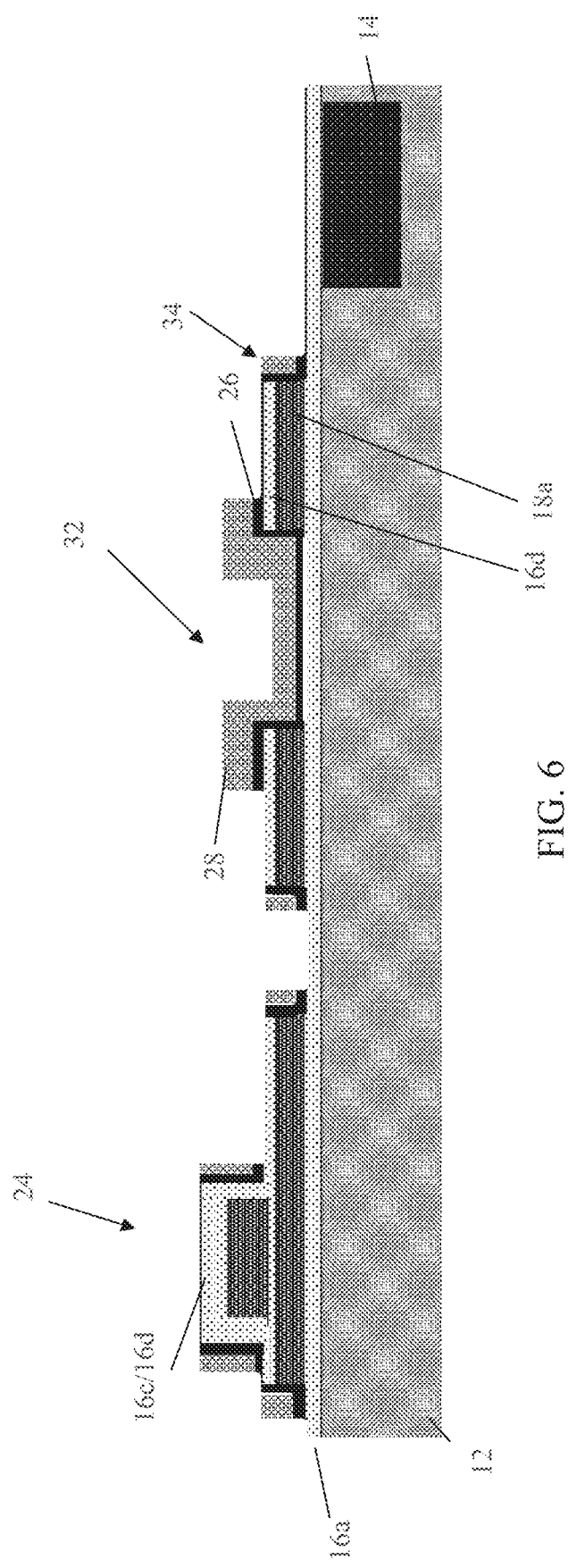
FIG. 6 shows a capacitor and thin film resistor, amongst other features, and respective fabrication processes in accordance with aspects of the present disclosure.

FIG. 6 shows a capacitor 24 and thin film resistor 32, amongst other features, and respective fabrication processes. More specifically, the capacitor 24 includes a bottom plate comprising the metal material 18a, a top plate (of smaller dimensions) comprising the metal material 18b, and the insulator material 16b between the top plate and the bottom plate. In addition, the top plate, e.g., metal material 18b, is covered by the insulator material 16c, 16d, and both the top plate and the bottom plate, e.g., metal material 18a, include spacer structures 34 composed of the patterned thin film of resistive metal alloy 26 and masking material 28. In the case of a DMIM, the bottom plate and the top plate of the DMIM is covered by the insulator material in FIG. 6. In addition, there is additional insulator material 16d between the top plate and the spacer structure 34 in DMIM, which is different from that in a SMIM implementation.

On the other hand, the thin film resistor 32 includes the thin film of resistive metal alloy 26 extending between and contacting the buffer contacts 25, e.g., metal material 18a. Moreover, the thin film of resistive metal alloy 26 and the buffer contacts 25 are on a same wiring level. In addition, the buffer contacts 25, e.g., metal material 18a, include spacer structures 34 composed of the patterned thin film of resistive metal alloy 26 and masking material 28. Moreover, the buffer contacts 25, e.g., metal material 18a, extend beyond the thin film of resistive metal alloy 26, thereby extending the contact area of the thin film resistor 32.

Figure 7:
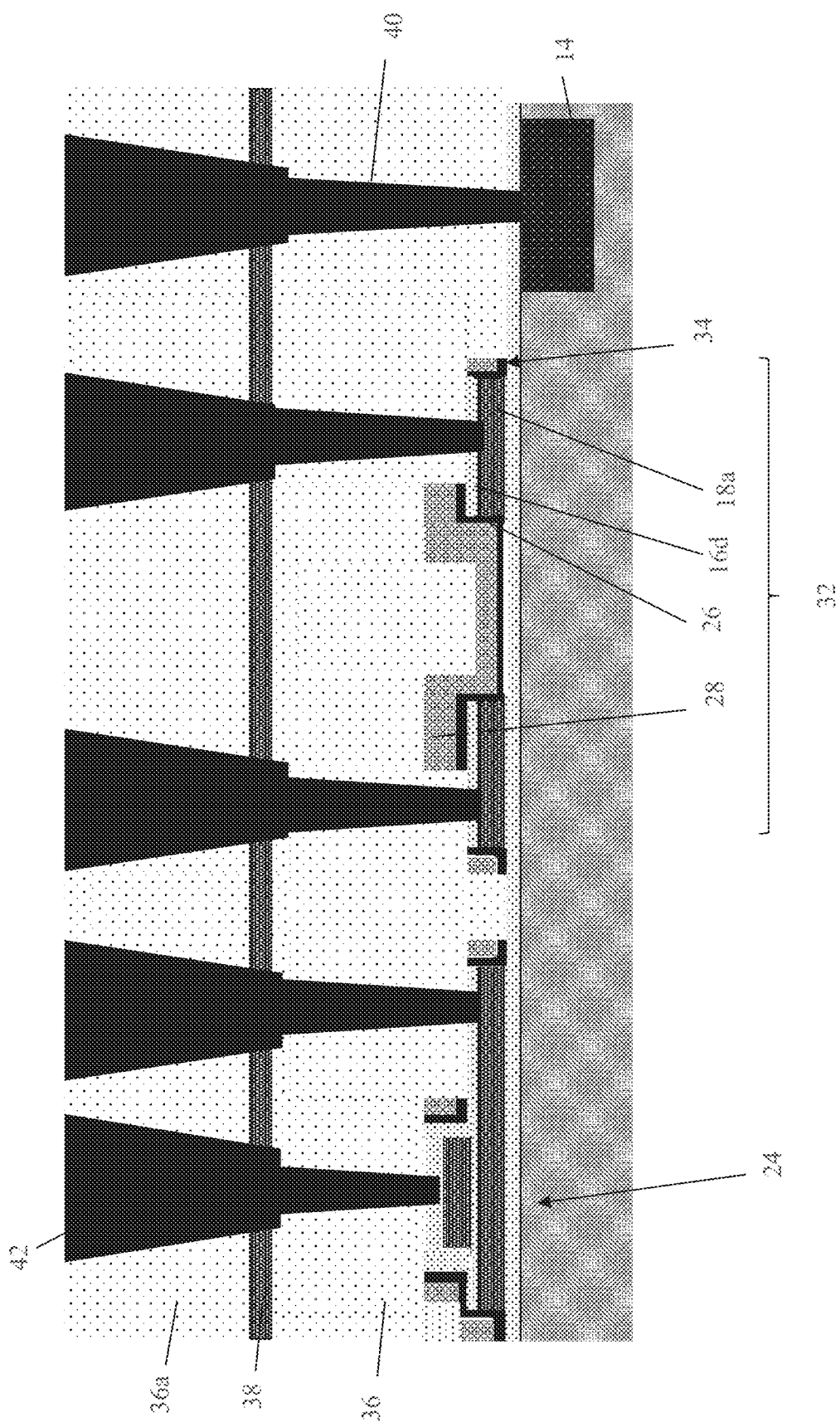
FIG. 7 shows contacts to the capacitor and thin film resistor, amongst other features, and respective fabrication processes in accordance with aspects of the present disclosure.

FIG. 7 shows contacts 40, 42 to the capacitor 24, thin film resistor 32, and metallization feature 14 (for CMOS logic). In embodiments, the contacts 40, 42 can be formed by two separate single damascene processes known in the art. For example, an interlevel dielectric material 36 is deposited over the capacitor 24, thin film resistor 32, and metallization feature 14 by conventional deposition methods, e.g., CVD. Following the deposition process, a CMP process is used to planarize the interlevel dielectric material 36 and trenches are formed in the interlevel dielectric material 36 to expose the top and bottom plate of the capacitor 24, the buffer contacts 25 of thin film resistor 32, and the metallization feature 14.

More specifically, using conventional lithography and etching process, as already described herein, trenches are formed to expose the top plate, e.g., metal material 18b, and bottom plate, e.g., metal material 18a of the capacitor 24, in addition to the metal material 18a of the buffer contacts 25 of the thin film resistor 32 and the metallization feature 14. A metal material, e.g., liner and metal fill, are then deposited within the trenches. Any residual metal material on the interlevel dielectric material 36 is removed by a CMP process. A SiN material 38 and second layer of interlevel dielectric material 36a is deposited on the interlevel dielectric material 36, followed by a subsequent trench and fill process as described herein to form the contacts 40, 42.

FIG. 8 shows a capacitor and thin film resistor, amongst other features, and respective fabrication processes in accordance with additional aspects of the present disclosure. In this embodiment, the layer of insulator material 16c and metal material 18b is no longer required; instead, in this embodiment, the capacitor 24a includes a bottom plate 18c formed within the substrate 12, a top plate formed of the metal material 18a, and the insulator material between the top plate and the bottom plate comprises the insulator material 16a. The bottom plate 18c is a metallization feature which can be formed with the same lithographic, etching and deposition processes as the metallization feature 14, with the footprint of the bottom plate 18c larger than the top plate 18a. In this embodiment, the contacts 40 of the capacitor 25 extend to the bottom plate 18c and the top plate 18a. Also, the thin film resistor 32 remains the same as disclosed in FIG. 7, and can be formed in the same manner as described above.

The structures can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first buffer contact on a substrate;
   a second buffer contact on the substrate, the second buffer contact being on a same wiring level as the first buffer contact;
   a resistive film contacting the first buffer contact and the second buffer contact, the resistive film extending on the substrate between the first buffer contact and the second buffer contact; and
   electrical contacts landing on both the first buffer contact and the second buffer contact, but not directly contacting with the resistive film, wherein:
   the first buffer contact and the second buffer contact are of a same material and are on a same wiring level as a plate of a metal-insulator-metal capacitor;
   the metal-insulator-metal capacitor comprises a top plate and a bottom plate which includes spacer structures comprising the resistive film and insulative material which also covers the resistive film; and
   additional insulator material is between the top plate and the spacer structure.

2. The structure of claim 1, wherein the first buffer contact and the second buffer contact comprise conductive material with insulator material on the conductive material.

3. The structure of claim 2, wherein:
   the resistive film is on an upper surface of the insulator material of the first buffer contact and the second buffer contact;
   the resistive film physically contacts an exposed, side surface of the conductive material of the first buffer contact and the second buffer contact; and
   the first buffer contact and the second buffer contact extend beyond the resistive film.

4. The structure of claim 3, wherein:
   the electrical contacts are in physical contact with the conductive material of the first buffer contact and the second buffer contact; and
   the resistive film is devoid of any physical contact with the electrical contacts.

5. The structure of claim 1, wherein the insulative material also covers the resistive film between and over the first buffer contact and the second buffer contact.

6. The structure of claim 1, wherein spacers are on sides of the first buffer contact and the second buffer contact, which oppose the exposed, side surface of the conductive material which contacts the resistive film.

7. The structure of claim 1, wherein the metal-insulator-metal capacitor includes the bottom plate, the insulator material, the top plate and a top insulator material, and the bottom plate is on the same wiring level as the first buffer contact and the second buffer contact.

8. A structure comprising:
   a first buffer contact on a substrate;
   a second buffer contact on the substrate, the second buffer contact being on a same wiring level as the first buffer contact;
   a resistive film contacting the first buffer contact and the second buffer contact, the resistive film extending on the substrate between the first buffer contact and the second buffer contact; and
   electrical contacts landing on both the first buffer contact and the second buffer contact, but not directly contacting with the resistive film, wherein:
   the first buffer contact and the second buffer contact are of a same material and are on a same wiring level as a plate of a metal-insulator-metal capacitor;
   the metal-insulator-metal capacitor includes a bottom plate, an insulator material, a top plate and a top insulator material;
   the bottom plate is within the substrate; and
   the top plate is on the same wiring level as the first buffer contact and the second buffer contact.

9. The structure of claim 8, wherein the top plate includes spacers comprising the resistive film and insulative material which also covers the resistive film.

10. A structure comprising:
    a capacitor structure comprising:
      a first plate comprising a conductive material;
      an insulator material on the first plate; and
      a second plate on the insulator material, the second plate comprising the conductive material; and
    a thin film resistor structure comprising:
      a first buffer contact on a same wiring level as the first plate of the capacitor;
      a second buffer contact on the same wiring level as the first plate of the capacitor and the first buffer contact; and
      a resistive film contacting sidewalls of the first buffer contact and the second buffer contact, the resistive film being located on the same wiring level as the first plate of the capacitor, the first buffer contact and the second buffer contact wherein:
      the first plate is a top plate of the capacitor;
      the top plate, the first buffer contact and the second buffer contact are composed of the conductive material; and
      the second plate is a bottom plate of the capacitor embedded within a substrate material, below a wiring level of the first buffer contact and the second buffer contact.

11. The structure of claim 10, wherein:
    the bottom plate, the first buffer contact and the second buffer contact are composed of the conductive material.

12. The structure of claim 11, further comprising spacers on the first plate and the second plate, wherein the spacers comprise the resistive film and insulative material over the resistive film.

13. The structure of claim 11, wherein:
    the first buffer contact and the second buffer contact comprise the insulator material on the conductive material;
    the first buffer contact and the second buffer contact extend beyond the resistive film;
    the resistive film is on an upper surface of the insulator material of the first buffer contact and the second buffer contact; and the resistive film physically contacts an exposed, side surface of the conductive material of the first buffer contact and the second buffer contact.

14. The structure of claim 13, further comprising electrical contacts in physical contact with the conductive material of the first buffer contact and the second buffer contact, and the resistive film is devoid of any physical contact with the electrical contacts.

15. The structure of claim 13, further comprising spacers on the first buffer contact and the second buffer contact, wherein:
the spacers comprise the resistive film and insulative material; and
the spacers are on sides of the first buffer contact and the second buffer contact, which oppose the exposed, side surface of the conductive material which contact the resistive film.

16. A method comprising:
forming a first buffer contact and second buffer contact each of which comprise a conductive plate;
forming a resistive film on a substrate which contacts and extends between the first buffer contact and the second buffer contact; and
forming electrical contacts landing on the first buffer contact and the second buffer contact, but not landing on the resistive film to avoid punch through, wherein
the first buffer contact and the second buffer contact are of a same material and are on a same wiring level as a plate of a metal-insulator-metal capacitor,
a top plate and a bottom plate of a capacitor include spacer structures comprising the resistive film and insulative material which also covers the resistive film, and
additional insulator material is between the top plate and the spacer structure.

* * * * *